(12) United States Patent
Geist et al.

(10) Patent No.: US 12,368,255 B2
(45) Date of Patent: Jul. 22, 2025

(54) CONFIGURABLE ELECTRICAL CARD CONNECTOR FOR CONNECTING TO CARDS OF DIFFERENT LENGTHS

(71) Applicant: DELL PRODUCTS L.P., Round Rock, TX (US)

(72) Inventors: Edward Davis Geist, Austin, TX (US); Tung Yi Chen, New Taipei (TW); Hsu-Min Jen, New Taipei (TW); Shu-Yu Jiang, New Taipei (TW); Rong Yu Wang, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 452 days.

(21) Appl. No.: 17/815,838

(22) Filed: Jul. 28, 2022

(65) Prior Publication Data

US 2024/0039193 A1 Feb. 1, 2024

(51) Int. Cl.
*H01R 12/72* (2011.01)
*G06F 1/18* (2006.01)
*H01R 12/73* (2011.01)
*H01R 13/502* (2006.01)
*H05K 1/18* (2006.01)
(Continued)

(52) U.S. Cl.
CPC ............ *H01R 12/721* (2013.01); *G06F 1/185* (2013.01); *H01R 12/735* (2013.01); *H01R 12/737* (2013.01); *H01R 13/502* (2013.01); *H05K 1/181* (2013.01); *H05K 3/36* (2013.01); *H01R 12/71* (2013.01); *H01R 12/712* (2013.01); *H01R 12/716* (2013.01); *H01R 12/72* (2013.01); *H01R 12/722* (2013.01); *H01R 12/727* (2013.01); *H01R 12/73* (2013.01); *H01R 13/5025* (2013.01); *H01R 13/506* (2013.01); *H01R 27/00* (2013.01); *H05K 1/18* (2013.01);
(Continued)

(58) Field of Classification Search
CPC .. H01R 12/721; H01R 12/735; H01R 12/737; H01R 13/502; H01R 12/71; H01R 12/712; H01R 12/716; H01R 12/72; H01R 12/722; H01R 12/727; H01R 12/73; H01R 13/5025; H01R 13/506; H01R 27/00; G06F 1/185; H05K 1/181; H05K 3/36; H05K 1/18; H05K 3/366; H05K 2201/09063; H05K 2201/10189
See application file for complete search history.

(56) References Cited

U.S. PATENT DOCUMENTS 6,017,248 A * 1/2000 Pan ..................... H01R 12/7005
439/681

* cited by examiner

*Primary Examiner* — Justin M Kratt
(74) *Attorney, Agent, or Firm* — McDermott Will & Emery LLP

(57) ABSTRACT

A card connector corresponding to a first card type associated with a plurality of electrical contacts for receiving cards corresponding to various card types, each card type associated with a set of electrical contacts fewer than, more than or the same number of electrical contacts as the first card type. An elongated body may be formed with a closed end and an open end. A cap may be positioned on the open end to configure the card connector in a closed configuration to support cards of a card type associated with fewer or the same number of electrical contacts. The cap may be removed to configure the card connector in an open configuration to support cards associated with more electrical contacts. The cap may have PCB connectors for positioning the cap a distance from the elongated body to configure the card connector in an augmented open configuration.

20 Claims, 11 Drawing Sheets

(51) Int. Cl.
  *H05K 3/36* (2006.01)
  *H01R 12/71* (2011.01)
  *H01R 13/506* (2006.01)
  *H01R 27/00* (2006.01)

(52) U.S. Cl.
  CPC ... *H05K 3/366* (2013.01); *H05K 2201/09063* (2013.01); *H05K 2201/10189* (2013.01)

CONFIGURABLE ELECTRICAL CARD CONNECTOR FOR CONNECTING TO CARDS OF DIFFERENT LENGTHS

BACKGROUND

Field of the Disclosure

This disclosure relates generally to information handling systems and, more particularly, to card connectors configurable for supporting cards of various card types.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems may utilize cards to expand the capability and functionality of the information handling system. A card may have a set of electrical contacts, wherein the number of electrical contacts on a card may depend on the card type.

SUMMARY

Embodiments disclosed herein may be generally directed to information handling systems with card connectors capable of supporting cards of different card types.

Embodiments may be generally directed to a card connector for supporting a card corresponding to a card type associated with fewer, more, or the same number of electrical contacts. The card connector may comprise an elongated body and a cap for coupling to the elongated body. The elongated body may correspond to a first card type associated with a plurality of electrical contacts and comprise a slot formed along a portion of a length of the elongated body, wherein the slot divides the elongated body into a first side and a second side, wherein the first side is connected to the second side at a first end to close the first end, wherein the first side is not connected to the second side at a second end to configure the card connector in an open configuration for receiving a card corresponding to a card type associated with a set of electrical contacts more than the plurality of electrical contacts. The cap may be configured for coupling to the elongated body to configure the card connector in a closed configuration for receiving a card corresponding to a card type associated with a set of electrical contacts fewer than or the same as the plurality of electrical contacts.

In some embodiments, the elongated body comprises a positioning feature and the cap comprises a channel for advancing the cap on the elongated body. In some embodiments, the elongated body comprises extensions extending laterally from the first side and the second side and the cap comprises a set of openings for receiving the extensions. In some embodiments, the cap is rotatable about the extensions. In some embodiments, the cap extends a length greater than the length of the elongated body and a width greater than a width of the elongated body, wherein the cap surrounds the elongated body in the closed configuration.

In some embodiments, the elongated body is mounted on a printed circuit board (PCB) having a plurality of sets of PCB openings at different distances relative to an elongated body mounted on the PCB. The cap may include a PCB connector for selective positioning in any set of the plurality of sets of PCB openings. A first set of PCB openings may be proximate to an end of the elongated body and a second set of PCB openings may be positioned a distance from the elongated body. The cap may be coupled to the elongated body with the PCB connector positioned in the first set of PCB openings such that the card connector is in a closed configuration for supporting a card having the same or fewer electrical contacts. The cap may be positioned in the second set of PCB openings such that the card connector is in an augmented open configuration for supporting a card having more electrical contacts. In some embodiments, the elongated body comprises a retaining feature and the cap comprises a recess for engaging the retaining feature.

Embodiments may be generally directed to an information handling system comprising a chassis, a printed circuit board (PCB), a card corresponding to a card type associated with a set of electrical contacts and a card connector comprising an elongated body and a cap. The elongated body may comprise a slot formed along a portion of a length of the elongated body, wherein the slot divides the elongated body into a first side and a second side, wherein the first side is connected to the second side at a first end to close the first end, wherein the first side is not connected to the second side at a second end. The elongated body may correspond to a card type associated with a plurality of electrical contacts fewer than, more than, or the same as the set of electrical contacts of the card. The cap may be configured for coupling to the elongated body to configure the card connector in a closed configuration or removed from the elongated body to configure the card connector in an open configuration. The cap may be positioned on the second end to configure the card connector in a closed configuration for receiving the card if the elongated body corresponds to a card type associated with a plurality of electrical contacts greater than or the same number of electrical contacts as the set of electrical contacts on the card, or the cap may be removed from the second end to configure the card connector in an open configuration for receiving the card if the elongated body corresponds to a card type associated with a plurality of electrical contacts less than the set of electrical contacts on the card.

In some embodiments, the elongated body comprises a positioning feature and the cap comprises a channel for advancing the cap on the elongated body. In some embodiments, the elongated body comprises extensions extending laterally from the first side and the second side and the cap comprises a set of openings for receiving the extensions. In some embodiments, the cap is rotatable about the extensions. In some embodiments, the cap extends a length greater than the length of the elongated body and a width greater than a width of the elongated body, wherein the cap surrounds the elongated body in the closed configuration. In some embodiments, the elongated body comprises a retaining feature and the cap comprises a recess for engaging the retaining feature.

In some embodiments, the PCB comprises a plurality of sets of PCB openings and the cap comprises a printed circuit board (PCB) connector for connecting to a set of PCB openings of the plurality of sets of PCB openings. The cap may be removed from the second end and positioned a distance from the elongated body to configure the card connector in an augmented open configuration for receiving the card if the elongated body corresponds to a card type associated with a plurality of electrical contacts less than the set of electrical contacts on the card.

In some embodiments, the card comprises a Peripheral Component Interconnect express (PCIe) card type. In some embodiments, the card comprises a x16 PCIe card type with a set of electrical contacts associated with sixteen lanes and the elongated body corresponds to a x8 PCIe card type with a plurality of electrical contacts associated with eight lanes. In some embodiments, the card comprises a x16 PCIe card type with a set of electrical contacts associated with sixteen lanes and the elongated body corresponds to a x4 PCIe card type with a plurality of electrical contacts associated with four lanes. In some embodiments, wherein the card comprises a x8 card type with a set of electrical contacts associated with eight lanes and the elongated body corresponds to a x4 PCIe card type with a plurality of electrical contacts associated with four lanes. In some embodiments, the card may include an air mover. In some embodiments, a first end of the card is coupled to the chassis.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

Figure 1:
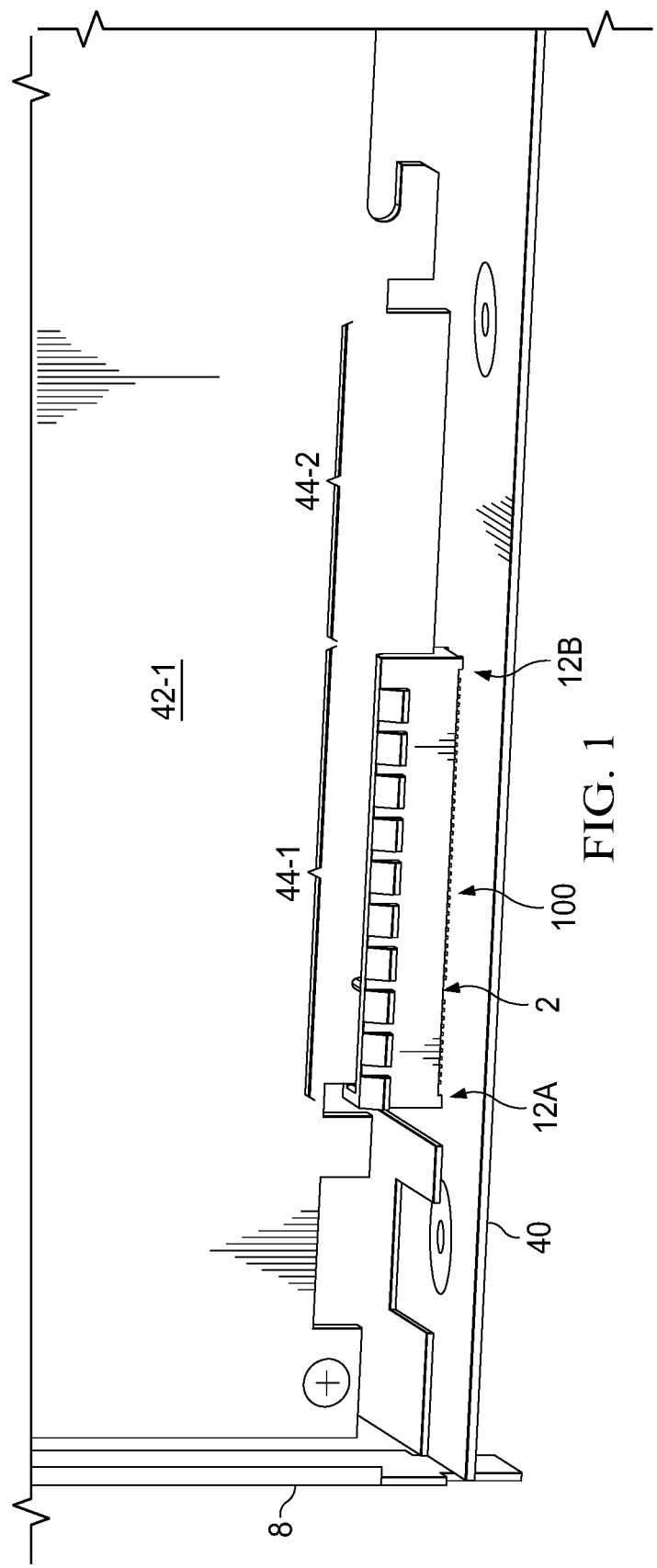
FIG. 1 depicts a perspective partial view of a chassis of an information handling system with a card connector associated with a first card type corresponding to a plurality of lanes for accommodating cards of a various card types having fewer, the same, or more lanes.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, card "42-1" refers to a card, which may be referred to collectively as cards "42" and any one of which may be referred to generically as card "42."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

Embodiments disclosed herein are described with respect to card connectors for supporting cards. Particular embodiments are best understood by reference to FIGS. 1, 2A-2D, 3A-3B, 4A-4B, 5A-5B and 6A-6C, wherein like numbers are used to indicate like and corresponding parts.

Turning to the drawings, FIG. 1 depicts a perspective partial view of a chassis 8 of an information handling system with one embodiment of a card connector 100 mounted on a printed circuit board 40 and coupled to a card 42-1.

Card 42 may have a plurality of electrical contacts (also referred to as "pins"), wherein the number of electrical contacts on card 42 corresponds to the card type. For example, a peripheral component interconnect express (PCIe) card is one type of card 42. A PCIe card used in a desktop information handling system may be, for example, a x4 card type associated with four lanes, a x8 card type associated with eight lanes or a x16 card type associated with sixteen lanes. In each PCIe card type, the number of lanes corresponds with a plurality of electrical contacts. For example, a x1 card type may have one lane with 36 electrical contacts, a x4 card type may have two lanes with 64 electrical contacts, a x8 card type may have eight lanes with 98 electrical contacts and a x16 card type may have sixteen lanes with 164 electrical contacts. Embodiments disclosed herein may be described as they pertain to PCIe card types but may work equally well with other card types in which the number of electrical contacts may be more, less, or the same as the number of electrical contacts in a PCIe card type.

A chassis for an information handling system might utilize a smaller card connector 100 (e.g., card connector 100 may be a x8 or x4 card type) to reduce the complexity or reduce the area needed on a printed circuit board (PCB) to accommodate card connector 100. Some desktop motherboards utilize "open-ended" PCIe connectors on PCIe slots smaller than x16 to accommodate longer card types. For example, a user might not need maximum performance from card 42. Referring to FIG. 1, card connector 100 allows a user to plug a larger card 42 (e.g., a x16 card) into a smaller card connector 100 (e.g., a x8 connector) in an information handling system. To accommodate card 42-1 of a card type associated with more lanes (and therefore more electrical contacts), card connector 100 may have elongated body 2 formed with first end 12A closed and second end 12B open, such that a first portion 44-1 of card 42-1 is plugged into card connector 100 but a second portion 44-2 of card 42-1 is not plugged into card connector 100.

Cards 42, particularly PCIe cards 42, have continued to increase in capability and performance. However, these increases result in increased mass of the card 42. Furthermore, components or systems on cards 42 such as air movers 50 may exert a torque on elongated body 2, particularly at the open end 12B. As the mass and stresses on cards 42 increase, open-ended card connectors 100 can crack, especially during shipping.

Embodiments include a card connector with a cap that can be positioned on an elongated body to configure the card connector in a closed configuration to improve the strength of the open end of the elongated body. The cap increases the strength of the card connector structure to prevent the card connector from being damaged during shipping.

Embodiments disclosed herein include a card connector corresponding to a card type associated with a plurality of electrical contacts but configurable for receiving and supporting any card corresponding to a card type associated with a set of electrical contacts less than, more than, or equal to the plurality of electrical contacts in the card connector.

Referring to one or more of FIGS. 2A-2D, card connector 200 may comprise elongated body 10 with slot 11 formed along a portion of a length (L) thereof. First side 11-1 and second side 11-2 are separated by slot 13. First side 11-1 and second side 11-2 may be connected at first end 12A to form a closed end. First side 11-1 and second side 11-2 are not connected at second end 12B, wherein second end 12B may be referred to as an open end.

Cap 14 may have a width 24 greater than a width of elongated body 10 and may have a length 22 for extending along a portion of length L of elongated body 10. Cap 14 may comprise channels 18 for translating cap 14 relative to positioning features 16. Cap 14 may comprise recesses 26 for engaging retaining features 20 on elongated body 10 to close second end 12B. Cap 14 may comprise edge 28 extending at least partially around cap 14 to facilitate a user advancing cap 14 onto elongated body 10 or removing cap 14 from elongated body 10.

Figure 2A:
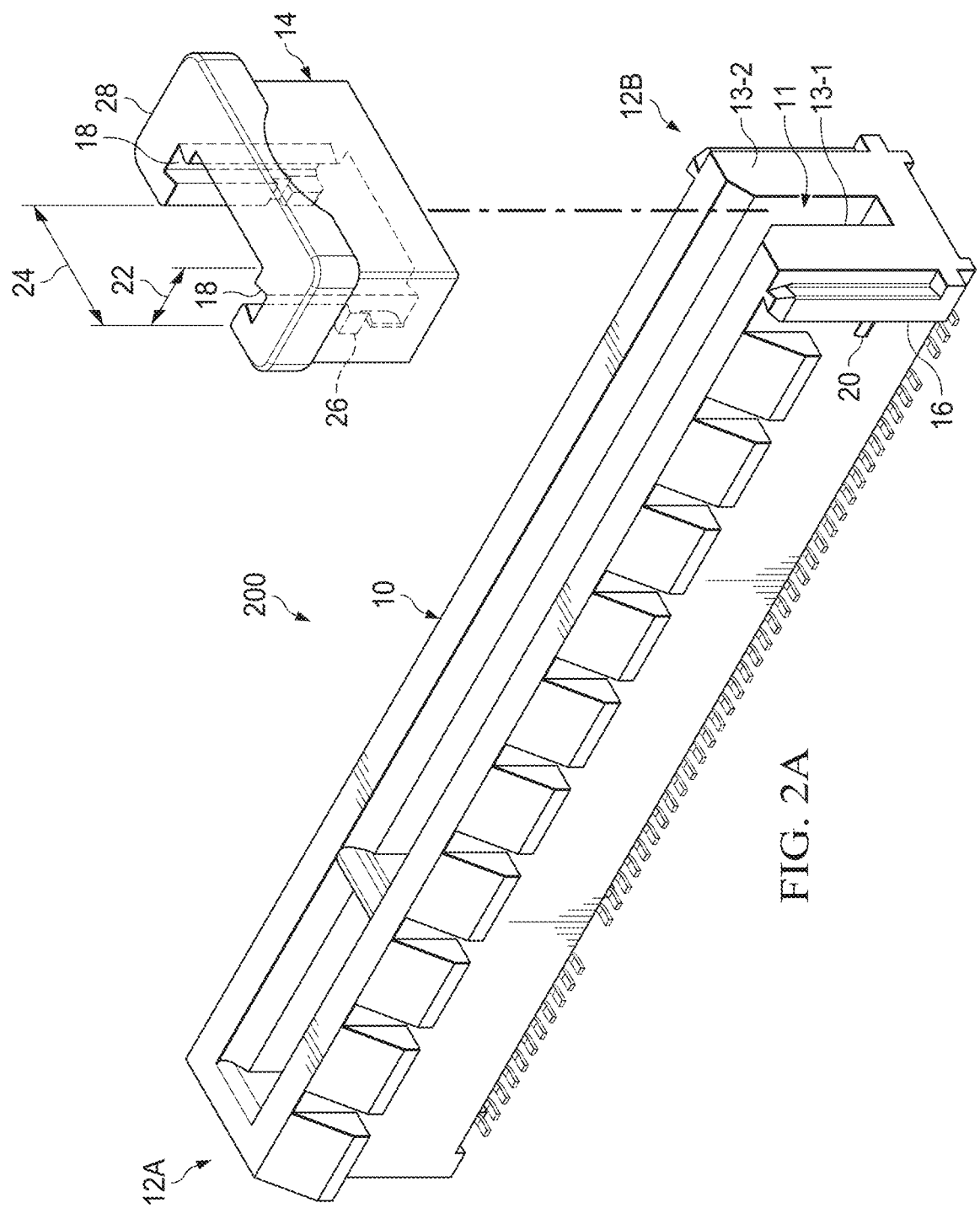
FIG. 2A depicts a perspective view of one embodiment of a card connector associated with a first card type in an open configuration with the cap removed for accommodating cards of a various card types having more lanes.

As depicted in FIG. 2A, cap 14 may be removed from elongated body 10 to configure card connector 200 in an open configuration for accommodating a card 42 corresponding to a card type associated with more electrical contacts.

Figure 2B:
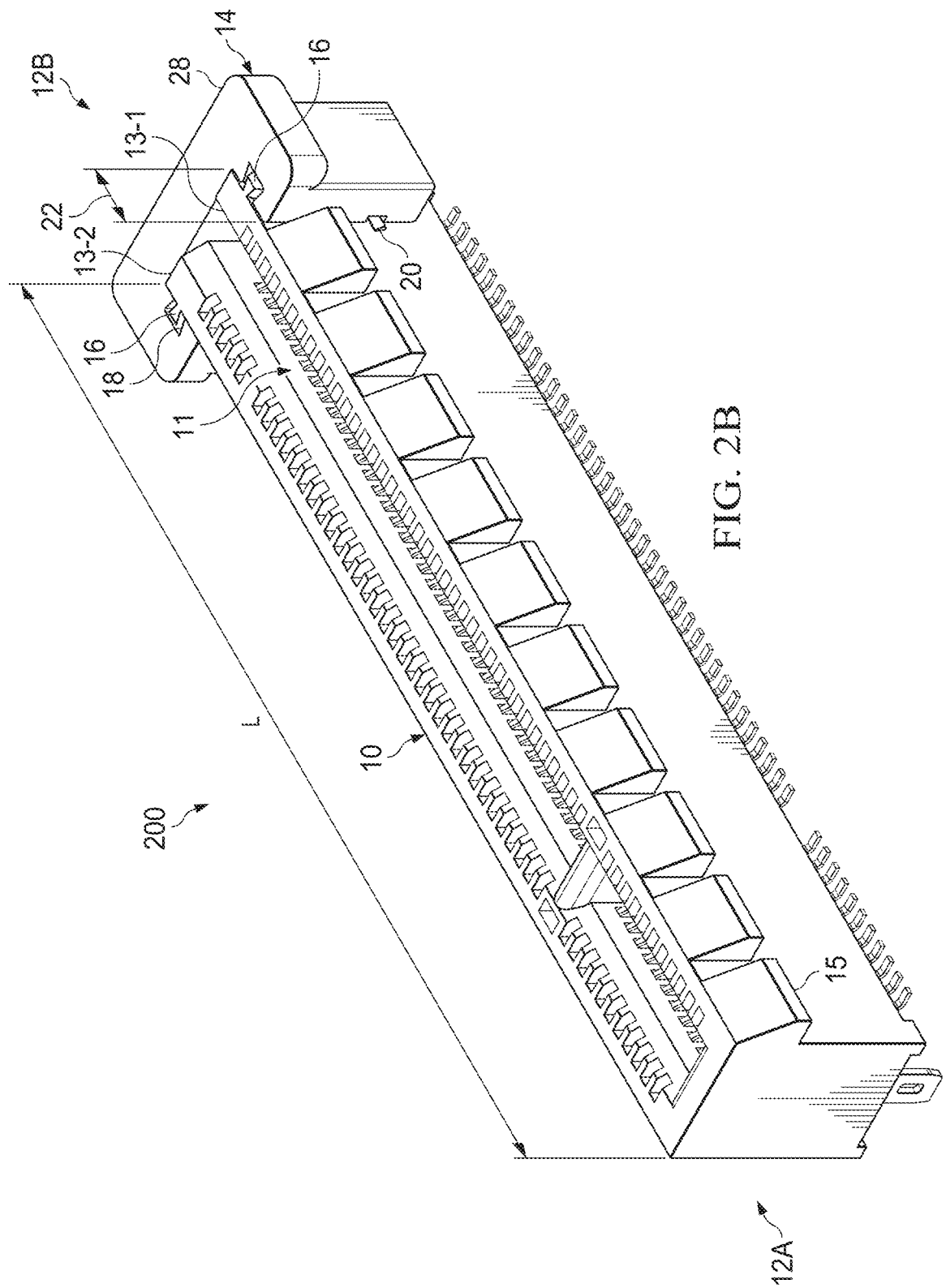
FIG. 2B depicts a perspective view of the embodiment of a card connector depicted in FIG. 2A, in a closed configuration for accommodating cards of a various card types having the same or fewer lanes.

As depicted in FIG. 2B, cap 14 may be positioned on second end 12B to close second 12B. In some scenarios, card connector 200 with both first end 12A and second end 12B closed may provide better support for cards 42 corresponding to card types associated with less or the same number of electrical contacts.

Figure 2C:
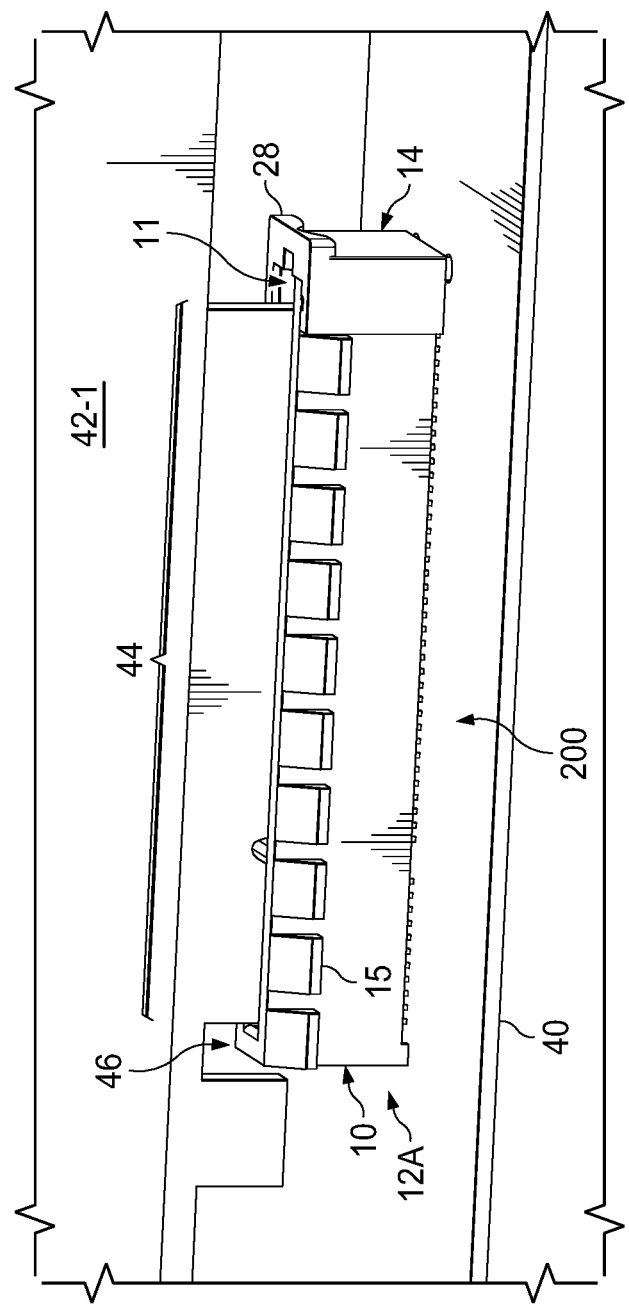
FIG. 2C depicts a perspective partial view of a chassis of an information handling system with the embodiment of a card connector depicted in FIGS. 2A and 2B, in a closed configuration and coupled to a card having the same number of lanes.
Figure 2D:
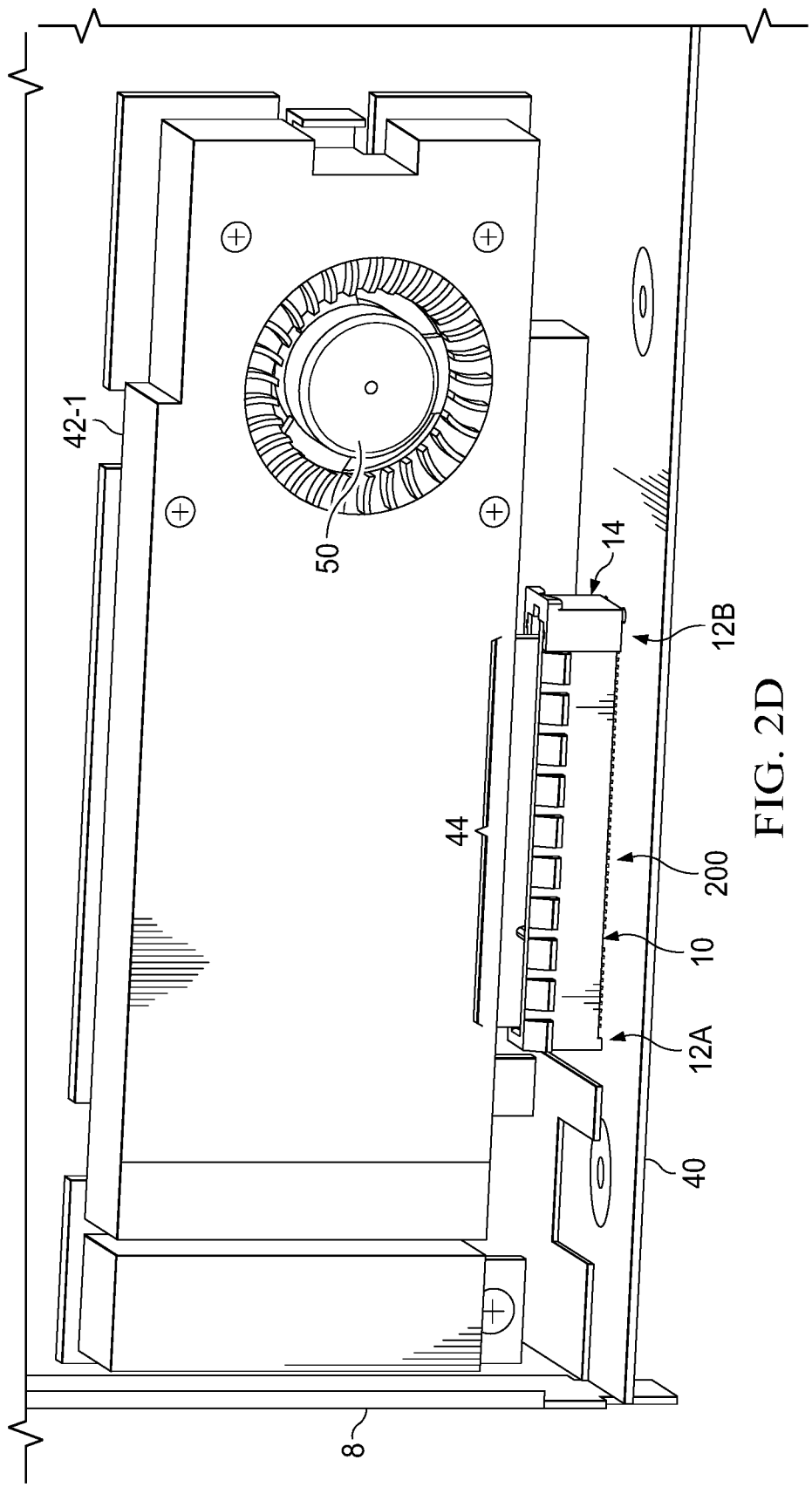
FIG. 2D depicts a perspective partial view of a chassis of an information handling system with the embodiment of a card connector depicted in FIGS. 2A-2C, in a closed configuration and coupled to a card having the same number of lanes and an air mover.

FIGS. 2C and 2D depict perspective partial views of a portion of chassis 8 of an information handling system with an embodiment of card connector 200 in a closed configuration for supporting card 42-1. Card 42-1 may be a card type associated with a plurality of electrical contacts (e.g., a x8 PCIe card type having 98 electrical contacts) but air mover 50 adds weight (and farther from chassis 8) and may apply a torque to elongated body 10 when generating an air flow. When card 42-1 is plugged into card connector 200, a portion 44 of card 42-1 may be advanced into slot 11 of card connector 200 in a closed configuration such that all of the plurality of electrical contacts associated with card 42 are in slot 11. Card 42-1 may be coupled to chassis 8 and first end 12A may be aligned in notch 46. Elongated body 10 may have connector features 15 extending laterally from one or more of first side 13-1 or second side 13-2 that limit cap 14 from extending the entire length of cap 14.

Figure 3A:
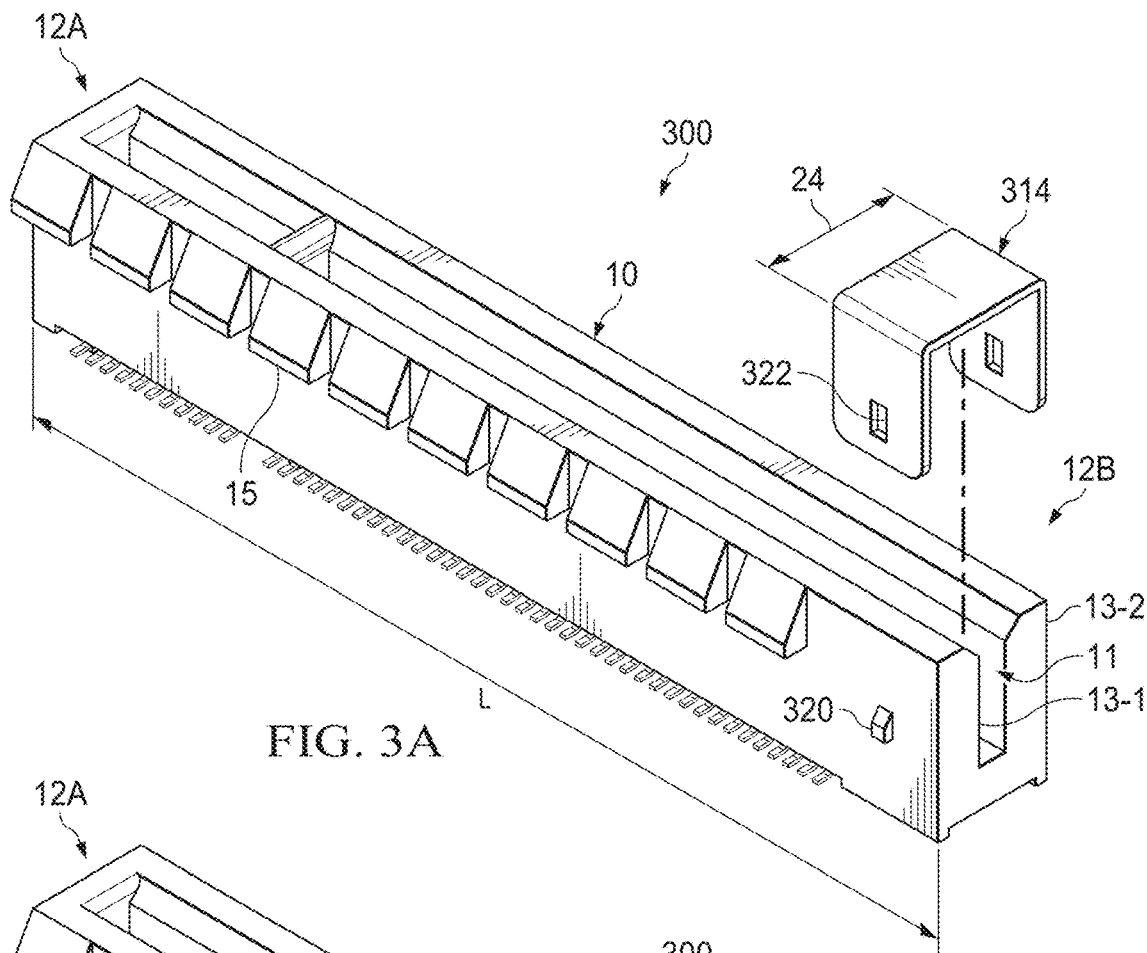
FIG. 3A depicts a perspective view of one embodiment of a card connector associated with a first card type in an open configuration with the cap removed for accommodating cards of a various card types having more lanes.
Figure 3B:
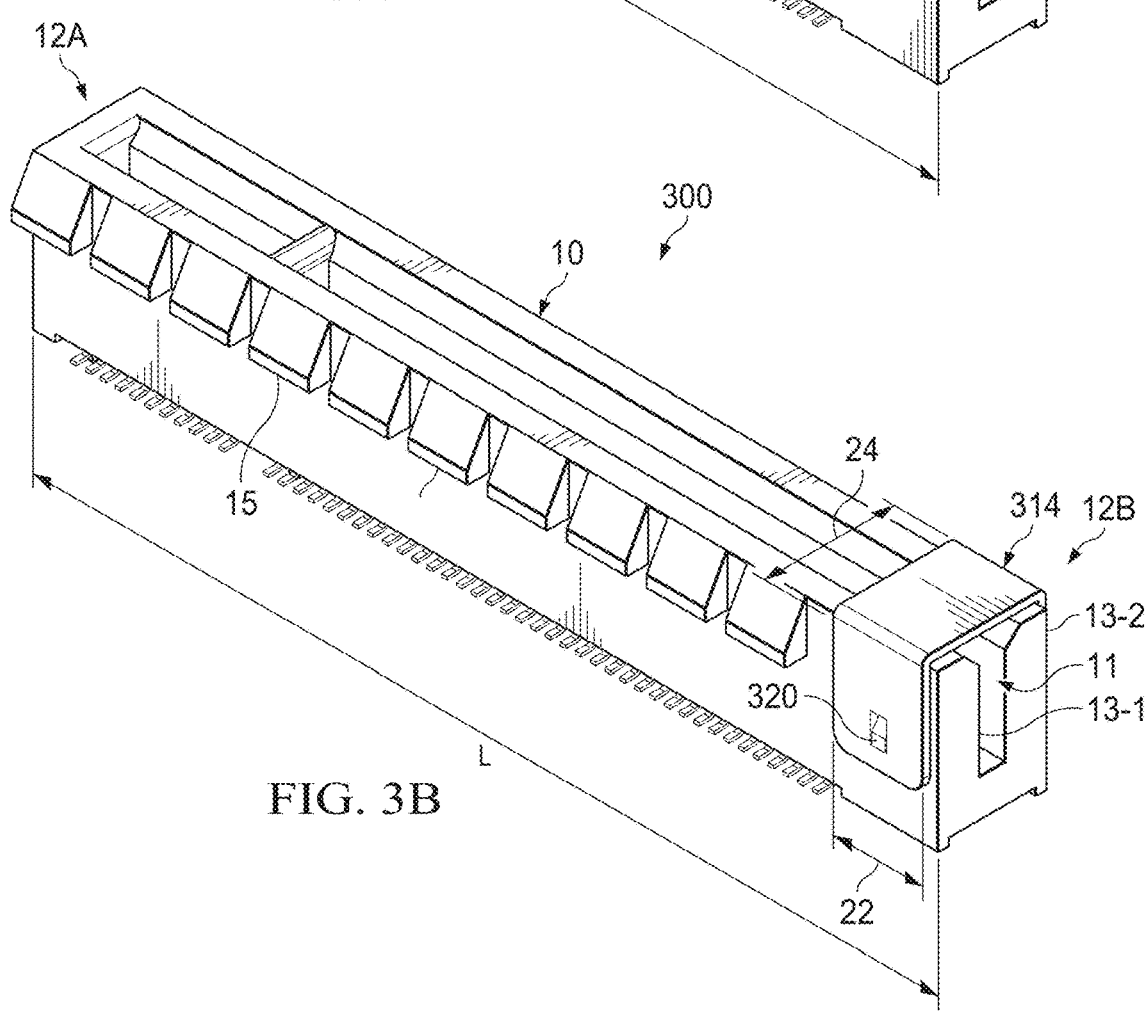
FIG. 3B depicts a perspective view of the embodiment of a card connector depicted in FIG. 3A, in a closed configuration for accommodating cards of a various card types having the same or fewer lanes.

FIGS. 3A and 3B illustrate perspective views of one embodiment of a card connector 300. FIG. 3A depicts card connector 300 with cap 314 removed such that card connector 300 is in an open configuration and FIG. 3B depicts card connector 300 with cap 314 positioned on second end 12B such that card connector 300 is in a closed configuration.

As depicted in FIG. 3A, cap 314 may have openings 322 and elongated body 10 may be formed with extensions 320 extending laterally from first side 13-1 and second side 13-2. Cap 314 may be formed of a resilient material to allow a user to deflect the sides of cap 314 to position cap 314 with extensions 322 in openings 322. A user may also remove cap 314 such that card connector 300 is in an open configuration for coupling to cards 42 corresponding to card types associated with more electrical contacts. As depicted in FIG. 3B, positioning cap 314 with extensions 320 in openings 322 configures card connector 300 in a closed configuration for providing more support to cards 42 corresponding to card types associated with the same or fewer electrical contacts.

Figure 4A:
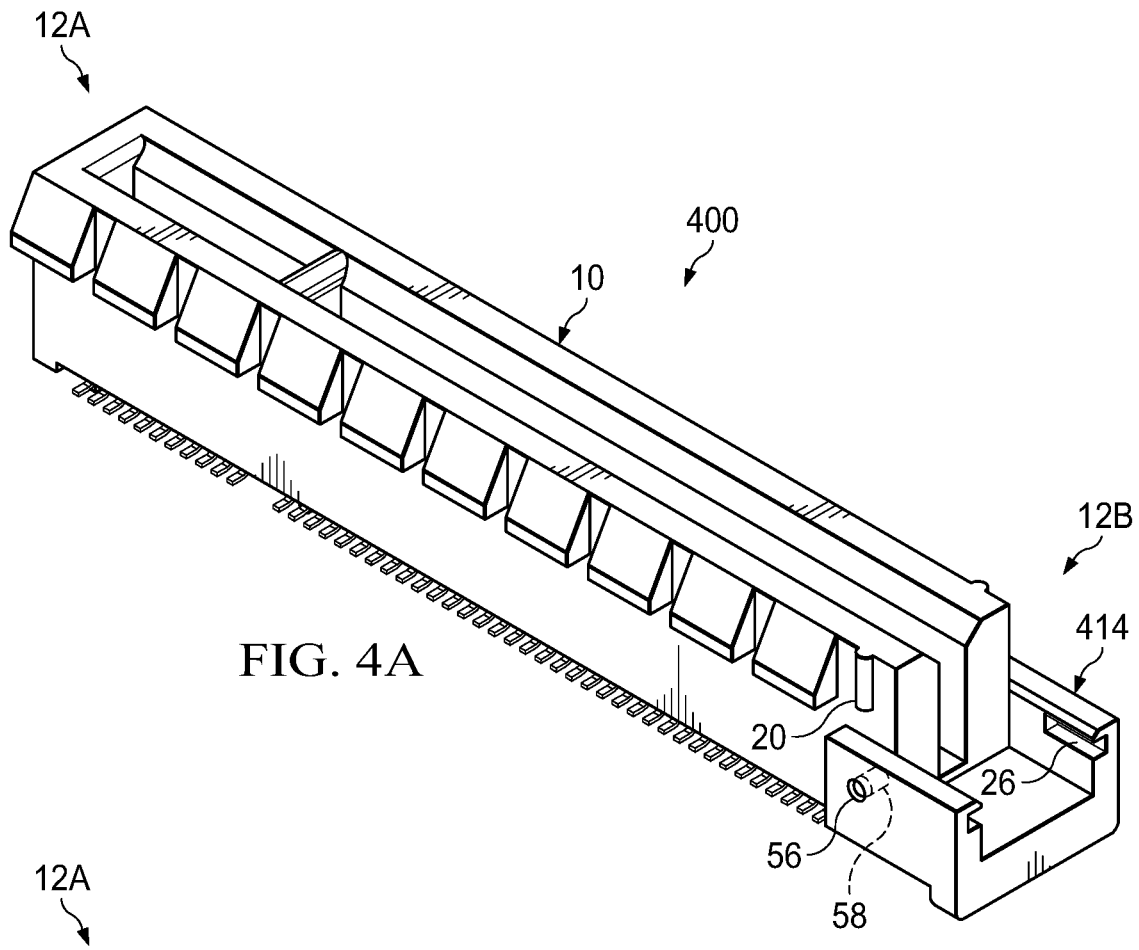
FIG. 4A depicts a perspective view of one embodiment of a card connector associated with a first card type, with the cap rotated to an open configuration for accommodating cards of a various card types having more lanes.
Figure 4B:
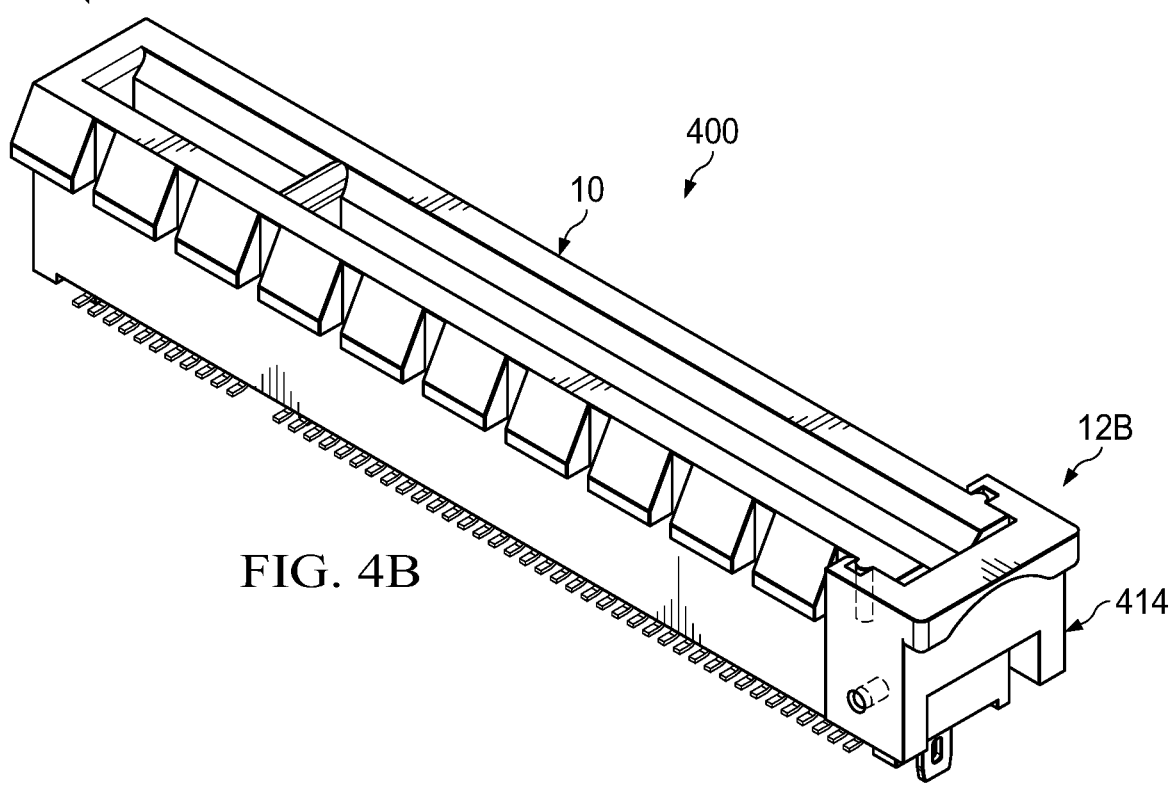
FIG. 4B depicts a perspective view of the embodiment of a card connector depicted in FIG. 4A, with the cap rotated to a closed configuration for accommodating cards of a various card types having the same or fewer lanes.

FIGS. 4A and 4B illustrate perspective views of one embodiment of a card connector 400 in which cap 414 may be rotatably coupled to elongated body 10. FIG. 4A depicts card connector 400 with cap 414 rotated such that card connector 400 is in an open configuration and FIG. 4B depicts card connector 400 with cap 414 rotated on second end 12B such that card connector 400 is in a closed configuration.

As depicted in FIG. 4A, cap 414 may have openings 56 and elongated body 10 may have extensions 58 on first side 13-1 and second side 13-2. When cap 414 is positioned with openings 58 on extensions 58, cap 414 may be rotatably coupled to elongated body 10 to allow a user to rotate cap 414 to configure card connector 400 in an open configuration for coupling to cards 42 of a card type with more electrical contacts. As depicted in FIG. 4B, rotating cap 414 to engage recesses 26 with extensions 20 configures card connector 400 in a closed configuration for providing more support to cards 42 of a card type associated with the same or fewer electrical contacts.

Figure 5A:
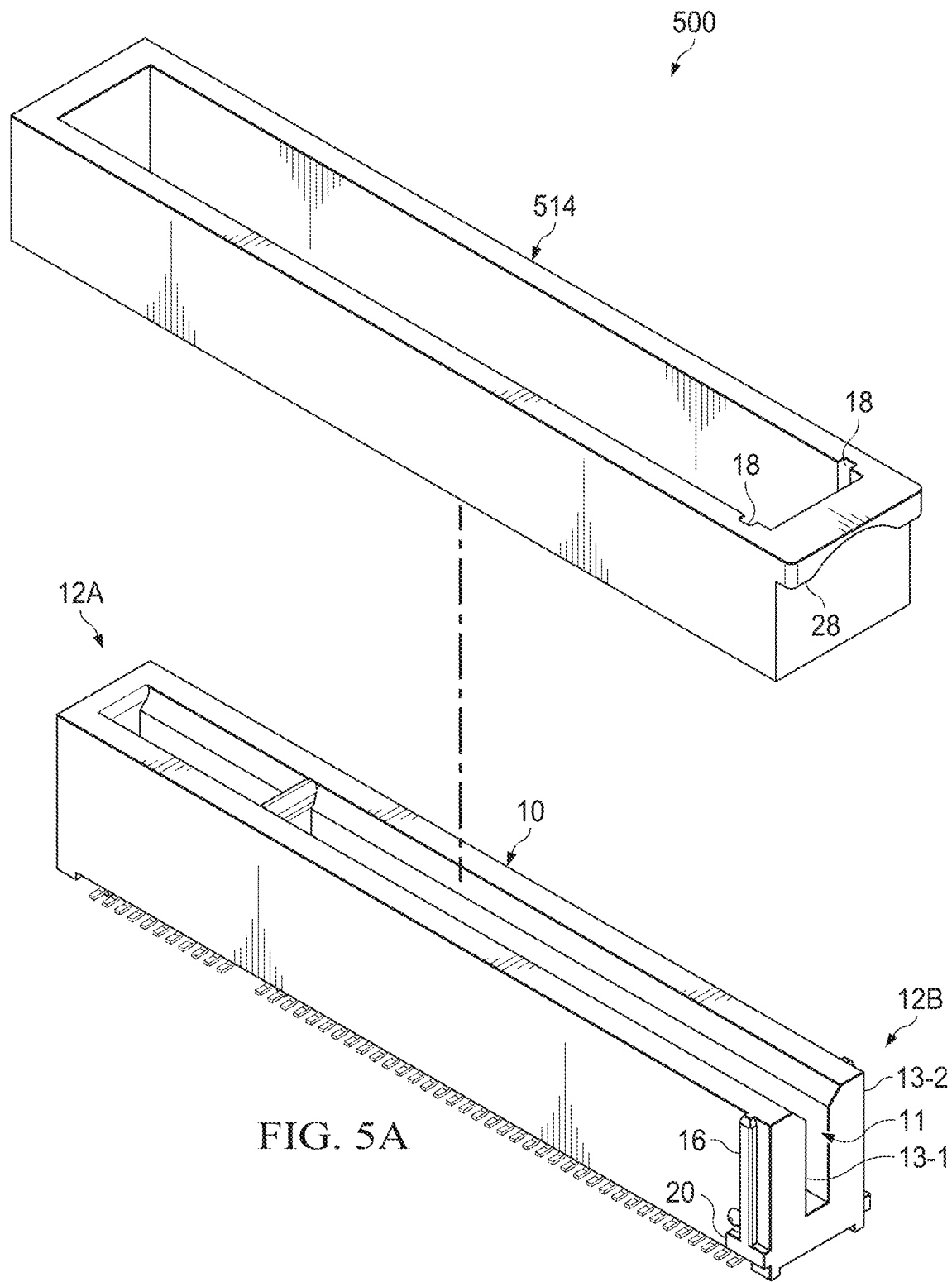
FIG. 5A depicts a perspective view of one embodiment of a card connector associated with a first card type, with the cap removed to configure the card connector in an open configuration for accommodating cards of a various card types having more lanes.
Figure 5B:
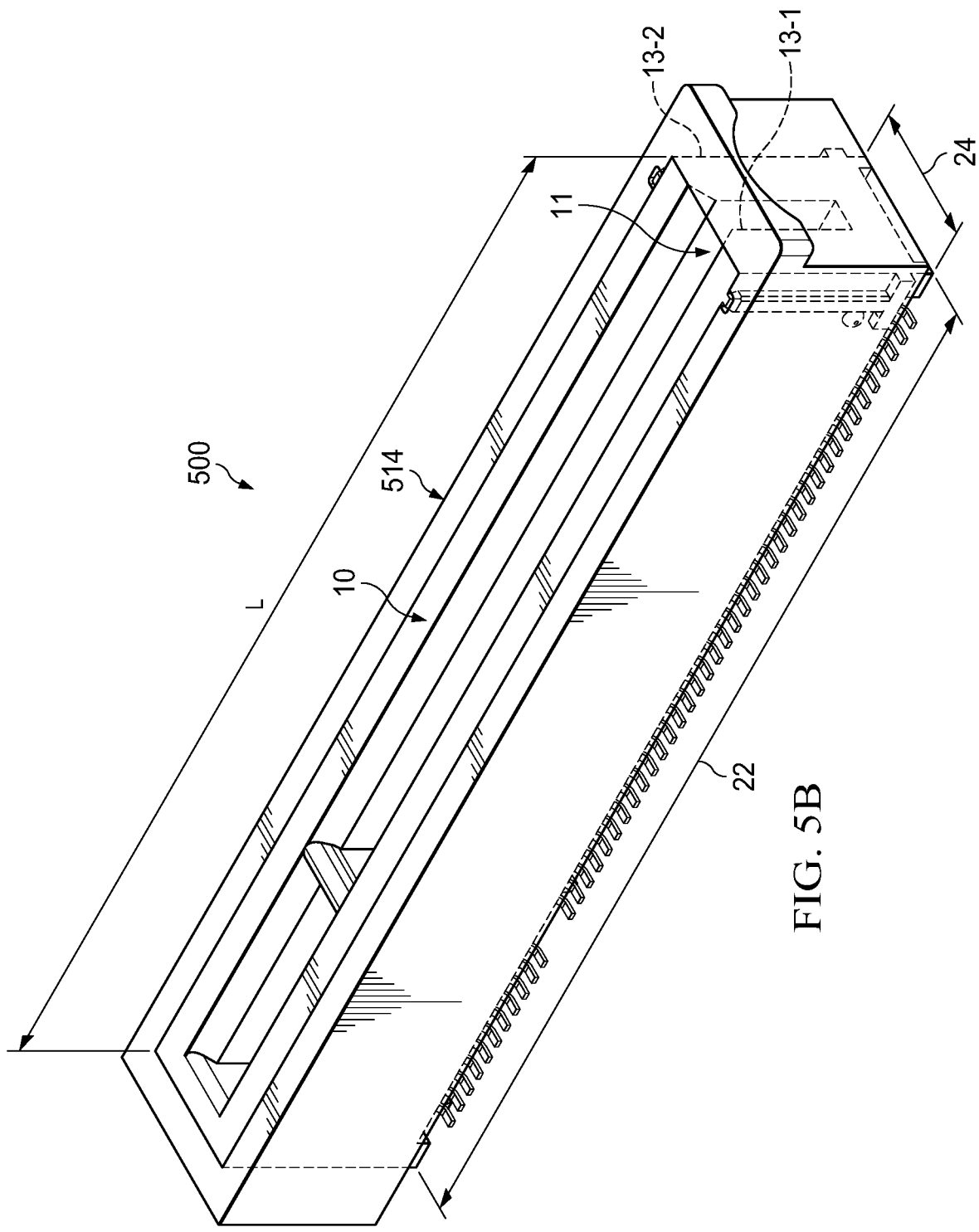
FIG. 5B depicts a perspective view of the embodiment of a card connector depicted in FIG. 5A, with the cap positioned to surround the elongated body to configure the card connector in a closed configuration for accommodating cards of various card types having the same or fewer lanes.

FIGS. 5A and 5B illustrate perspective views of one embodiment of a card connector 500 in which cap 514 may extend to surround elongated body 10. As depicted in FIG. 5A, cap 514 may have a length 22 greater than length L of elongated body 10 and a width 24 greater than a width of elongated body 10. First side 13-1 and second side 13-2 of elongated body 10 may be formed as continuous surfaces (without features 15 as depicted in FIG. 1 for example).

Cap 514 may comprise channels 18 for translating cap 514 relative to positioning features 16 on first side 13-1 and second side 13-2 of elongated body 10. Cap 514 may comprise recesses 26 for engaging retaining features 20 on elongated body 10 to close second end 12B. Cap 514 may comprise edge 28 extending at least partially around cap 514 to facilitate a user advancing cap 514 onto elongated body 10 or removing cap 514 from elongated body 10.

FIG. 5A depicts card connector 500 with cap 514 removed such that card connector 500 is in an open configuration. As depicted in FIG. 5B, cap 514 may be positioned on elongated body 10 such that cap 514 surrounds elongated body 10. Recesses 26 on cap 514 may engage extensions 20 on elongated body to configure card connector 500 in a closed configuration, wherein card connector 500 may provide more support to cards 42 corresponding to card types associated with the same or fewer number of electrical contacts.

Augmented Open Configuration

Figure 6A:
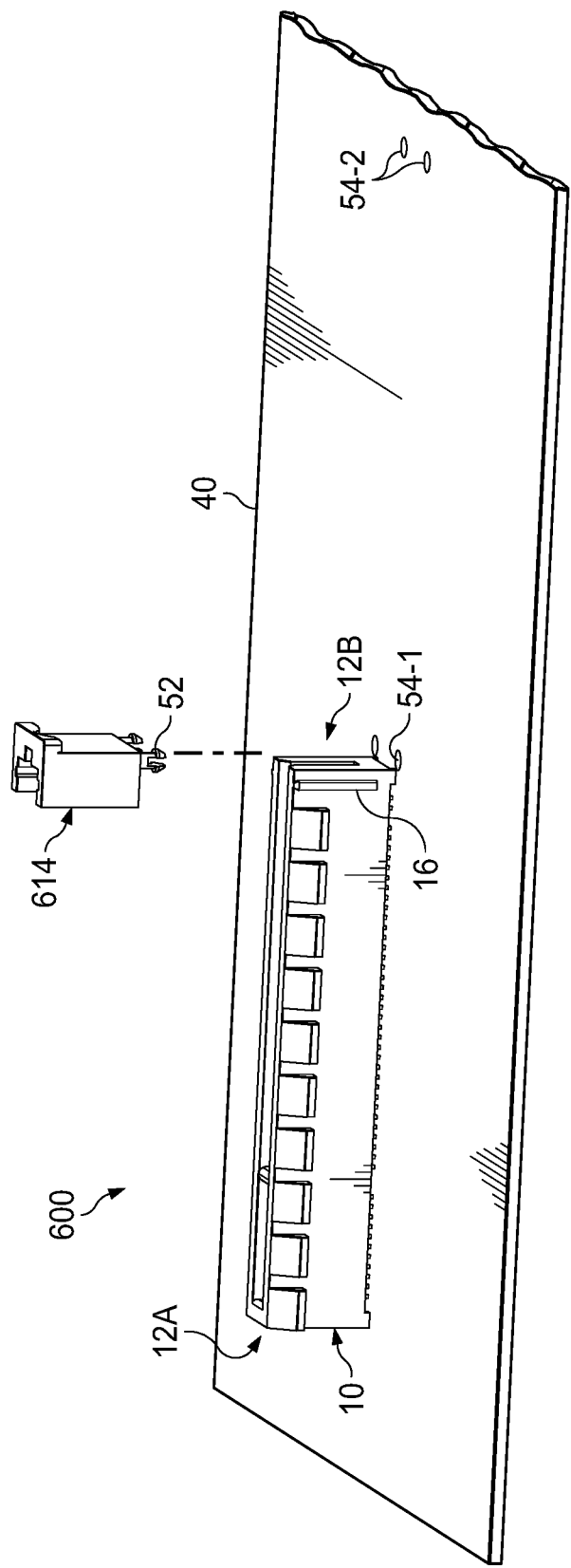
FIG. 6A depicts a perspective partial view of a chassis of an information handling system with one embodiment of a card connector associated with a first card type, with the cap removed to configure the card connector in an open configuration for accommodating cards of various card types having more lanes.
Figure 6B:
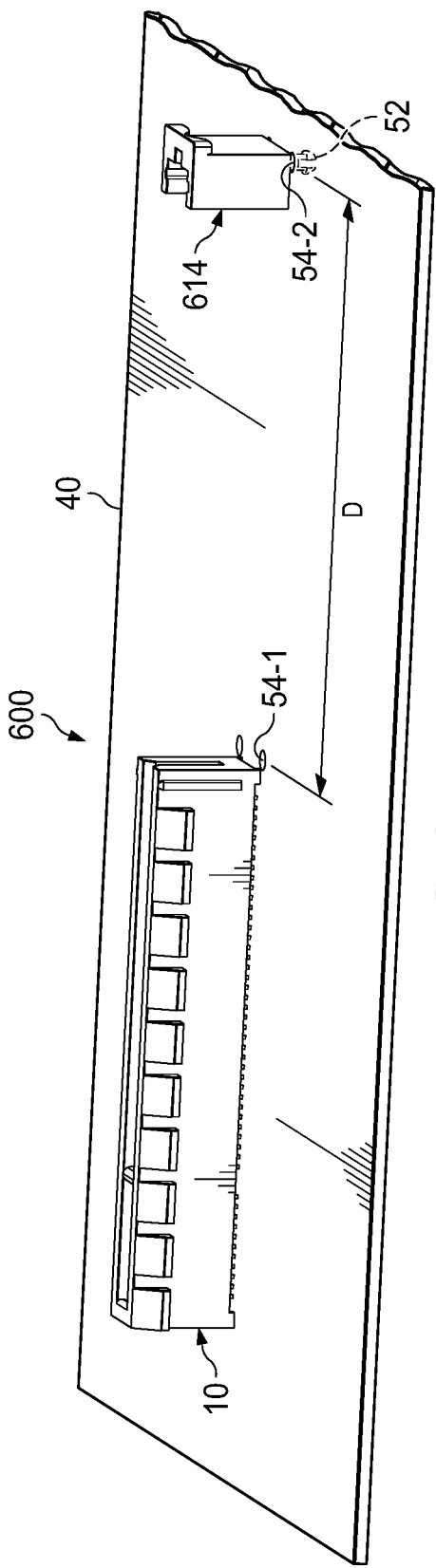
FIG. 6B depicts a perspective partial view of a chassis of an information handling system with the embodiment of a card connector depicted in FIG. 6A, with the cap positioned a distance from the elongated body to configure the card connector in an augmented open configuration for accommodating cards of various card types having the same or fewer lanes.
Figure 6C:
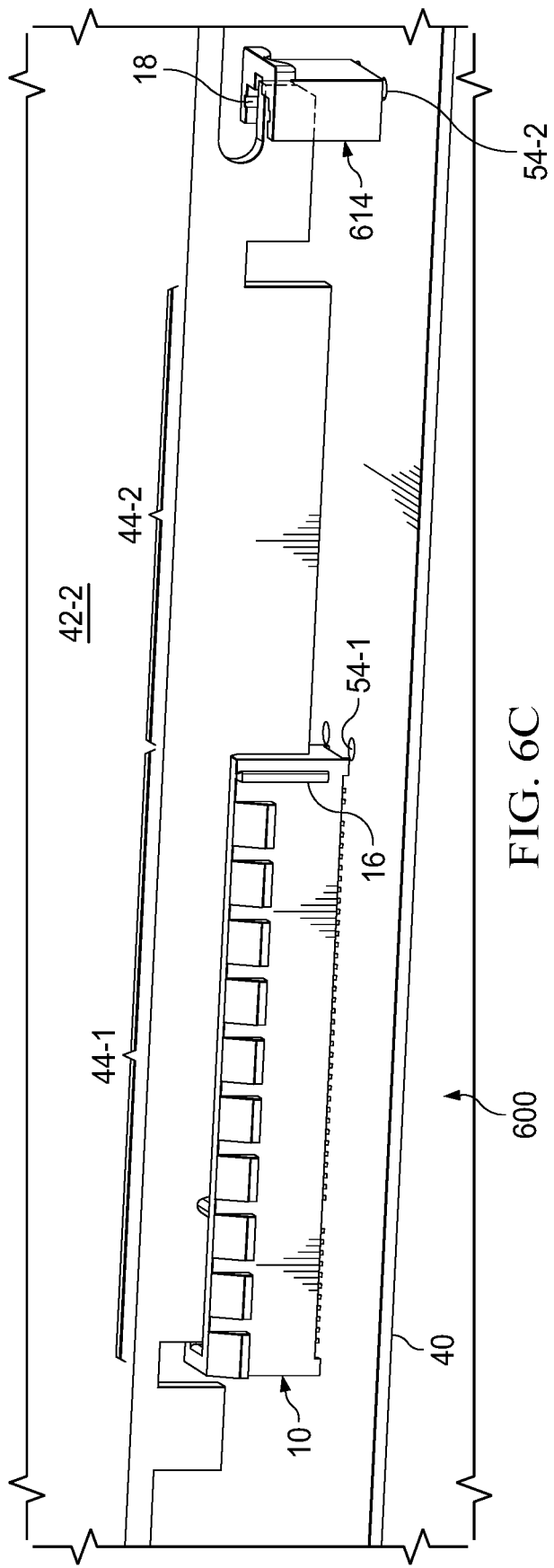
FIG. 6C depicts a perspective partial view of a chassis of an information handling system with the embodiment of a card connector depicted in FIG. 6B, with the cap positioned a distance from the elongated body and coupled to a card of a card type having more lanes, the card connector in an augmented open configuration.

FIGS. 6A-6C depict views of an embodiment of card connector 600 configurable in a closed configuration, an open configuration, or an augmented open configuration. Elongated body may be formed similar to elongated body 10 depicted in any of FIGS. 2A-2D, 3A-3B or 5A-5B. Cap 614 may comprise channels 18 for advancing cap 614 on positioning features 16 and may further include PCB connectors 52. PCB 40 may comprise a plurality of sets of PCB openings 54 for receiving PCB connectors 52.

FIG. 6A depicts a perspective partial view of an information handling system in which an embodiment of card connector 600 is mounted on a printed circuit board (PCB) 40 and cap 614 is removed from elongated body 10. This configuration may be referred to as an open configuration. Although not shown, cap 614 may be positioned on second end 12B of elongated body 10 to configure card connector 600 in a closed configuration, such as by advancing cap 614 with channels 18 on positioning features 16. PCB connectors 52 in PCB openings 54-1 may provide additional support for a card 42 plugged into slot 11 of elongated body 10.

FIG. 6B depicts a perspective partial view of an information handling system in which an embodiment of card connector 600 is mounted on a printed circuit board (PCB) 40 and cap 614 is positioned in a second set of PCB openings 54-2 a distance D from the first set of PCB openings 54-1. This configuration may be referred to as an augmented open configuration.

FIG. 6C depicts a perspective partial view of the information handling system depicted in FIGS. 6A-6B, in which card connector 600 corresponds to a card type associated with a plurality of electrical contacts and is in an augmented open configuration to support card 42-2 with more electrical contacts. Card 42-2 may correspond to a card type associated with more electrical contacts, wherein first portion 44-1 of card 42-2 may be positioned in slot 11 of elongated body but second portion 44-2 is not coupled to elongated body 10. However, configuring card connector 600 in an augmented open configuration with cap 614 positioned in a set of PCB openings 54-2 some distance from elongated body 10 may provide support to card 42-2 at some other location.

An information handling system may be manufactured with elongated body 10 mounted on a PCB 40. The design of elongated body, the available space inside chassis 8, the weight or dimensions of card 42 may determine which card connector 200, 300, 400, 500 or 600 may be used to support card 42. The card connector 200, 300, 400, 500 or 600 may be configured in a closed configuration to protect card connector 200, 300, 400, 500 or 600 during shipping. A user may configure card connector 200, 300, 400, 500 or 600 in a closed configuration, an open configuration or an augmented open configuration to accommodate plugging in a card 42 corresponding to any card type associated with less, more or the same number of electrical contacts.

Components of an information handling system may include, but are not limited to, a processor subsystem, which may comprise one or more processors, and a system bus that communicatively couples various system components to processor subsystem including, for example, a memory subsystem, an I/O subsystem, a local storage resource, and a network interface.

A processor subsystem may comprise a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, a processor subsystem may interpret and execute program instructions and process data stored locally (e.g., in a memory subsystem). In the same or alternative embodiments, a processor subsystem may interpret and execute program instructions and process data stored remotely (e.g., in a network storage resource).

A system bus may refer to a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

A memory subsystem may comprise a system, device, or apparatus operable to retain and retrieve program instructions and data for a period of time (e.g., computer-readable media). A memory subsystem may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, is powered down.

In an information handling system 100, an I/O subsystem may comprise a system, device, or apparatus generally operable to receive and transmit data to or from or within the information handling system. An I/O subsystem may represent, for example, a variety of communication interfaces, graphics interfaces, video interfaces, user input interfaces, and peripheral interfaces. In various embodiments, an I/O subsystem may be used to support various peripheral devices, such as a touch panel, a display adapter, a keyboard, a touch pad, or a camera, among other examples. In some implementations, an I/O subsystem may support so-called 'plug and play' connectivity to external devices, in which the external devices may be added or removed while an information handling system is operating.

A local storage resource may comprise computer-readable media (e.g., hard disk drive, floppy disk drive, CD-ROM, and other type of rotating storage media, flash memory, EEPROM, or another type of solid-state storage media) and may be generally operable to store instructions and data.

A network interface may be a suitable system, apparatus, or device operable to serve as an interface between information handling system 100 and a network (not shown). A network interface may enable information handling system 100 to communicate over a network using a suitable transmission protocol or standard. In some embodiments, a network interface may be communicatively coupled via a network to a network storage resource (not shown). A network coupled to a network interface may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to a network interface may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to a network interface or various components associated therewith may be implemented using hardware, software, or any combination thereof.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A card connector, comprising:
   an elongated body corresponding to a first card type associated with a plurality of electrical contacts, the elongated body comprising a slot formed along a portion of a length of the elongated body, wherein the slot divides the elongated body into a first side and a second side, wherein the first side is connected to the second side at a first end to close the first end, wherein the first side is not connected to the second side at a second end to configure the card connector in an open configuration for receiving a card corresponding to a card type associated with a set of electrical contacts more than the plurality of electrical contacts; and
   a cap configured for coupling to the elongated body to configure the card connector in a closed configuration for receiving a card corresponding to a card type associated with a set of electrical contacts fewer than or the same as the plurality of electrical contacts.

2. The card connector of claim 1, wherein:
   the elongated body comprises a positioning feature; and
   the cap comprises a channel for advancing the cap on the elongated body.

3. The card connector of claim 1, wherein:
   the elongated body comprises extensions extending laterally from the first side and the second side; and
   the cap comprises a set of openings for receiving the extensions.

4. The card connector of claim 3, wherein the cap is rotatable about the extensions.

5. The card connector of claim 3, wherein the cap extends a length greater than the length of the elongated body and a width greater than a width of the elongated body, wherein the cap surrounds the elongated body in the closed configuration.

6. The card connector of claim 1, wherein:
   the elongated body is mounted on a printed circuit board (PCB) comprising a plurality of sets of PCB openings; and
   the cap comprises a printed circuit board (PCB) connector for connecting to a set of PCB openings of the plurality of sets of PCB openings.

7. The card connector of claim 1, wherein:
   the elongated body comprises a retaining feature; and
   the cap comprises a recess for engaging the retaining feature.

8. An information handling system, comprising:
   a chassis;
   a printed circuit board (PCB);
   a card corresponding to a card type associated with a plurality of electrical contacts; and
   a card connector comprising:
      an elongated body comprising a slot formed along a portion of a length of the elongated body, wherein the slot divides the elongated body into a first side and a second side, wherein the first side is connected to the second side at a first end to close the first end, wherein the first side is not connected to the second side at a second end to configure the card connector in an open configuration for receiving a card corresponding to a card type associated with a set of electrical contacts more than the plurality of electrical contacts; and a cap configured for coupling to the elongated body to configure the card connector in a closed configuration for receiving a card corresponding to a card type associated with a set of electrical contacts fewer than or the same number as the plurality of electrical contacts.

9. The information handling system of claim 8, wherein: the elongated body comprises a positioning feature; and the cap comprises a channel for advancing the cap on the elongated body.

10. The information handling system of claim 8, wherein: the elongated body comprises extensions extending laterally from the first side and the second side; and the cap comprises a set of openings for receiving the extensions.

11. The information handling system of claim 10, wherein the cap is rotatable about the extensions.

12. The information handling system of claim 10, wherein the cap extends a length greater than the length of the elongated body and a width greater than a width of the elongated body, wherein the cap surrounds the elongated body in the closed configuration.

13. The information handling system of claim 8, wherein: the PCB comprises a plurality of sets of PCB openings; and the cap comprises a printed circuit board (PCB) connector for connecting to a set of PCB openings of the plurality of sets of PCB openings, wherein the cap is removed from the second end and positioned a distance from the elongated body to configure the card connector in an augmented open configuration for receiving the card if the elongated body corresponds to a card type associated with a set of electrical contacts fewer than the plurality of electrical contacts.

14. The information handling system of claim 8, wherein: the elongated body comprises a retaining feature; and the cap comprises a recess for engaging the retaining feature.

15. The information handling system of claim 8, wherein the card comprises a Peripheral Component Interconnect express (PCIe) card.

16. The information handling system of claim 8, wherein the card comprises a x16 Peripheral Component Interconnect express (PCIe) card type associated with a plurality of electrical contacts corresponding to sixteen lanes and the elongated body corresponds to a x8 PCIe card type associated with a plurality of electrical contacts corresponding to eight lanes.

17. The information handling system of claim 8, wherein the card comprises a x16 PCIe card type associated with a plurality of electrical contacts corresponding to sixteen lanes and the elongated body corresponds to a x4 PCIe card type associated with a plurality of electrical contacts corresponding to four lanes.

18. The information handling system of claim 8, wherein the card comprises a x8 PCIe card type associated with a plurality of electrical contacts corresponding to eight lanes and the elongated body corresponds to a x4 PCIe card type associated with a plurality of electrical contacts corresponding to four lanes.

19. The information handling system of claim 8, wherein the card includes an air mover.

20. The information handling system of claim 8, wherein a first end of the card is coupled to the chassis.

* * * * *